United States Patent
Ackermann et al.

(10) Patent No.: US 7,947,947 B2
(45) Date of Patent: May 24, 2011

(54) LED-BASED LIGHT MODULE PACKAGE INCLUDING A CERAMIC LAYER AND A LIGHT SENSOR

(75) Inventors: Bernd Ackermann, Eindhoven (NL); Hans-Helmut Bechtel, Eindhoven (NL); Achim Hilgers, Eindhoven (NL); Matthias Wendt, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 166 days.

(21) Appl. No.: 12/439,810

(22) PCT Filed: Sep. 20, 2007

(86) PCT No.: PCT/IB2007/053819
§ 371 (c)(1), (2), (4) Date: Mar. 3, 2009

(87) PCT Pub. No.: WO2008/041150
PCT Pub. Date: Apr. 10, 2008

(65) Prior Publication Data
US 2009/0278034 A1    Nov. 12, 2009

(30) Foreign Application Priority Data
Oct. 5, 2006 (EP) .................................. 06121788

(51) Int. Cl.
*H01J 5/02* (2006.01)
(52) U.S. Cl. ........................................ 250/239; 250/551
(58) Field of Classification Search .................. 250/239, 250/551, 214.1, 214 AL, 214 B; 257/80–85, 257/432–435, 678–680, 700–705
See application file for complete search history.

(56) References Cited

U.S. PATENT DOCUMENTS

| | | | |
|---|---|---|---|
| 4,132,899 A * | 1/1979 | Shigemasa et al. | 250/577 |
| 6,250,774 B1 | 6/2001 | Begemann et al. | |
| 6,617,795 B2 | 9/2003 | Bruning | |
| 7,045,820 B2 | 5/2006 | Hayashi et al. | |
| 7,064,498 B2 | 6/2006 | Dowling et al. | |
| 2002/0130326 A1 | 9/2002 | Tamura et al. | |
| 2003/0043107 A1 | 3/2003 | Ruby et al. | |
| 2004/0114355 A1 | 6/2004 | Rizkin et al. | |
| 2004/0145301 A1 | 7/2004 | Yoshida | |
| 2005/0133686 A1 | 6/2005 | Ng et al. | |
| 2005/0180698 A1 | 8/2005 | Hauffe et al. | |
| 2006/0071229 A1 | 4/2006 | Guenter | |

FOREIGN PATENT DOCUMENTS

| | | |
|---|---|---|
| EP | 1067824 A2 | 1/2001 |
| WO | 2006061763 A1 | 6/2006 |
| WO | 2006087660 A1 | 8/2006 |
| WO | 2006097876 A1 | 9/2006 |

* cited by examiner

Primary Examiner — Que T Le

(57) ABSTRACT

Disclosed is a light module package including a mounting substrate for mounting and electrically contacting at least one light emitting diode and a ceramic layer disposed in a path of light emitted by the light emitting diode. The ceramic layer includes a wavelength converting material and the light emitting diode is disposed between the ceramic layer and the mounting substrate. The light module package also includes a light sensor disposed at the mounting substrate for detecting a luminous output of the light emitting diode in order to control the brightness and/or the color of the light leaving the light module. The ceramic layer is only partly translucent to shield the light sensor against ambient light.

9 Claims, 2 Drawing Sheets

LED-BASED LIGHT MODULE PACKAGE INCLUDING A CERAMIC LAYER AND A LIGHT SENSOR

Figure 1:
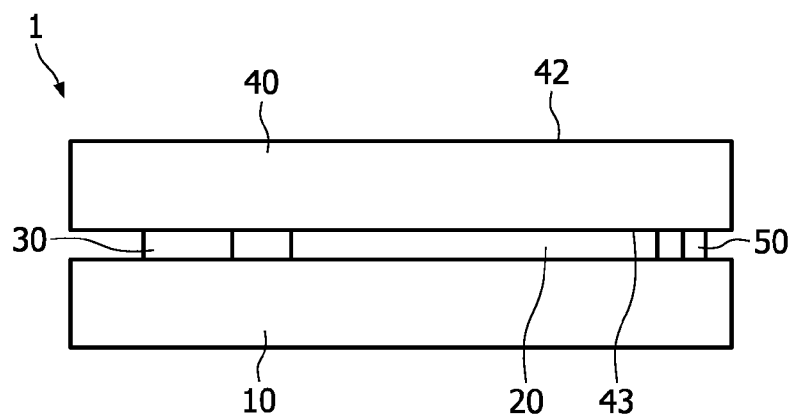

This application is a national stage application under 35 U.S.C. §371 of International Application No. PCT/IB2007/053819 filed on Sep. 20, 2007, which claims priority to European Application No. 06121788.1, filed on Oct. 5, 2006, incorporated herein by reference.

This invention relates to a light module package with a light emitting diode mounted on a substrate and a layer, which converts the emitted light of the light emitting diode, wherein the brightness and/or the color of the light leaving a light module package is controlled.

It is known to sense temperature at the light emitting diode (LED) or to sense light output at the LED, and to utilize the sensed temperature or sensed light output as a feedback to a power supply. A controller is usually used with these light module packages for at least "turning-on" and "turning-off" the LEDs. The light output and/or color of the LEDs may also be adjustably controlled by the controller. This requires the use of light or optical sensors for sensing the lumen output and/or color (a wavelength) of the light device and providing this information to the controller. In such light module packages, sensing a luminous output of an LED may provide a benefit over sensing a temperature at the LED. Specifically, sensing luminous output of a LED allows compensation for both temperature-induced and age-induced degradation of a luminous output by the LED. This kind of light device is described in U.S. Pat. No. 6,617,795 B2. The light module package includes a support member, which mounts two or more LEDs, at least one feedback sensor for reporting quantitative and spectral information to a controller external to the package, and a signal processing circuit for preparing the signals generated by the one or more sensors for digital processing by the controller. Passive optics are mounted over the LED, sensors and the signal processing circuit, on the support member 12 for optically manipulating the light produced by the package. Disadvantageously, measuring the luminous output of the LED is disturbed by ambient light shining onto the light sensor. In order to detect the luminous output of an LED, accurately, all other externals stray light sources, i.e. sunlight, must be disregarded.

EP 1 067 824 A2 discloses that the impact of the LED and ambient light onto the light sensor signal can be separated by modulating the LED light and appropriately correlating the modulation pattern and the sensor signal. However, this involves complicated drive and control schemes. The complications encountered increase with increasing the number of LEDs or LED strings the brightness of which has to be controlled, since the light from one LED (string) has to be separated from the ambient light and the light from the adjacent LEDs or LED strings. In the US 2005/133686 A1 it is proposed to measure individually the brightness of single LEDs. However, complicated constructions are used in order to guide the light of each single LED to its associated light sensor.

The invention has for its object to improve the above mentioned light module package. In particular, it is an object of the present invention to provide a light module package with a simple setup, wherein a stabilized flux can be applied controlling the brightness and/or the color of the emitted light and/or their spatial distribution.

This object is achieved by a light module package as taught by claim 1 of the present invention. Advantageous embodiments of the inventive package are defined in the subclaims.

Accordingly, a light module package is provided with a mounting substrate for mounting and electrically contacting at least one light emitting diode, a ceramic layer disposed in a path of light emitted by the light emitting diode, wherein the ceramic layer comprises a wavelength converting material, the light emitting diode disposed between the ceramic layer and the mounting substrate and a light sensor disposed at the mounting substrate detecting a luminous output of the light emitting diode in order to control the brightness and/or the color of the light leaving the light module, wherein the ceramic layer is only partly translucent to shield the light sensor against ambient light.

One of the essential ideas of this invention is based on the fact that a ceramic layer is disposed in the light module package converting the primary light emitted by the LED into a secondary light leaving said light module package. Advantageously, the ceramic layer is composed of or includes a wavelength converting material such as a phosphor. The luminescent ceramic layer according to the invention is more robust and less sensitive to the temperature then prior art phosphor layers. In order to detect the luminous output of the LED accurately, the ceramic layer is only partly translucent shielding the light sensor against ambient light. During the drive of the light module package the luminescent ceramic layer acts as an "active light source", from which light is leaving the light module package. While the ceramic layer converts the emitted light of the LED into a secondary light with a different wavelength, the ambient light does not affect the measurement of the light sensor essentially. Preferably, the impact of manufacturing spread of the brightness of the produced light of the light module package can be compensated by calibration, variations of brightness with aging and temperature variations are compensated by using feedback control by detecting the luminous output. The light sensor provides a feedback signal to a power supply so that the power supply can control the current provided to the LED. Advantageously, the light sensor is integrated in the light module package, wherein in this way a package with optimized form factor, thin, flat, can be achieved.

Preferably, the sensitive area of the light sensor is faced directly to the ceramic layer. Thus, the light sensor detects the converted light of the ceramic layer.

According to the preferred embodiment of the present invention the ceramic layer and the light sensor are extremely thin. The light sensor can be disposed between the mounting substrate and the ceramic layer. Alternatively, the light sensor can be integrated into the mounting substrate.

In another embodiment it is also possible that the ceramic layer comprises a light guide, which is directed to the light sensor. In this case the light guide transports the desired amount of luminous output from the ceramic layer to the light sensor, which is e.g. embedded into the substrate. Said light guide can be part of the ceramic layer. Advantageously, the light guide is nose-shaped, wherein the ending of the light guide is located in a distance to the light sensor. Alternatively, the light guide extends to the light sensor, wherein the ending of the light guide contacts the top face of the light sensor.

In another preferred embodiment the light guide can be made of a different material as the ceramic layer, wherein said light guide is located between the ceramic layer and the light sensor.

If desired, additionally a reflecting layer can be disposed at the ceramic layer providing an additional shielding against ambient light in order to ensure that the luminous output detected by the light sensor is not influenced by external light sources in general.

The light sensor working as a feedback sensor can comprise one or more optical sensors, one or more temperature (thermal) sensors, and preferably, a combination of at least one optical sensor and at least one temperature (thermal) sensor. The optical sensor can comprise a conventional photo sensor such as a photo diode. The optical sensor reports the luminous output of the LED in quantitative (light intensity) and/or spectral (wavelength) terms, to an external controller.

Additionally, a temperature sensor is disposed at the mounting substrate measuring the temperature of the LED and/or of the light sensor. The temperature sensor may comprise a semi-conductor diode junction, a band gap reference circuit or any other thermal sensing element used in the integrated circuit art. The thermal sensor reports the quantitative and spectral output of the LED to the external controller by measuring the temperature of the mounting substrate, which in turn can be correlated to the operating temperature of the LED. The temperature sensor and the light sensor provide a feedback signal to the power supply, which can drive the individual LED module with stabilized flux, predetermined brightness and/or color.

In a preferred embodiment of the invention the light sensor is disposed adjacent to the ceramic layer. In this way the signal contrast of the light sensor is enhanced, due to large light acceptance angle of the optically coupled sensor for light generated in the ceramic layer, compared to external light. Also, light from adjacent LEDs can be shielded, effectively. Thus, the light sensor detects the luminous output of this LED, wherein the measurement of the light sensor is not effected by the output of adjacent LEDs. Advantageously, the LED is connected with an AC or a DC driving circuit.

The luminescent ceramic layer can be attached to the LED, light sensor, mounting substrate by, for example, a waver bonding, sintering, gluing, with thin layers of known organic adhesives such epoxy or a silicone, gluing with high index inorganic adhesives, and gluing with sol-gel-glasses. An advantage of the luminescent ceramic layer is the ability to mold, grind, machine, hot stamp or polish the ceramic layer into shapes that are desirable, for example for increased light extraction.

Additionally, optical elements like lenses, fibers etc can be arranged on the light module package. Preferably, the surface of the ceramic layer comprises a lens, a dome lens, a Fresnel lens or a surface of the ceramic layer is textured. A LED device using more than one light module package can exhibit undesired brightness variations of the emitted light due to brightness variations of the light sources. LED modules with stabilized flux can be used to suppress such brightness variations of the emitted light. In an initial calibration the (relative) brightness values of the individual light sources resulting in the best possible homogeneous brightness distribution of the emitted light are determined. Subsequently, each light module package with stabilized flux controls its brightness to the desired value, even against variations due to aging and temperature. In a similar way, the color and brightness of a LED source comprising light module packages with stabilized flux and different primary colors can be controlled in a simple feed forward way just by commanding to each light module package the brightness (flux) it shall generate which has been determined in an initial calibration procedure. Also, for larger color variable LED devices, that use e.g. several LEDs to make a light of one color, brightness/color variations of the light emitted by the complete LED device can be suppressed by using light module packages with stabilized flux and driving the individual light module package to predetermined brightness/flux conditions.

The light module package of the present invention with stabilized flux can be applied to LED lighting applications, where the brightness and color of the emitted light and/or their spatial distribution shall be controlled.

The light module package according to the present invention can be used in a variety of systems amongst them systems being household application systems, LCD backlight systems, projection systems (LED beamers), automotive illumination (e.g. head lamps), shop lighting systems, home lighting systems, accent lighting systems, spot lighting systems, fibre-optics application systems, projection systems, self-lit display systems, segmented display systems, warning sign systems, medical lighting application systems, mobile phone display systems, indicator sign systems, decorative lighting systems or electronic systems in a flexible environment, such as textiles and other wearables.

The aforementioned components, as well as the claimed components and the components to be used in accordance with the invention in the described embodiments, are not subject to any special exceptions with respect to their size, shape, material selection and technical concept such that the selection criteria known in the pertinent field can be applied without limitations.

Additional details, characteristics and advantages of the object of the invention are disclosed in the subclaims and the following description of the respective figures—which in an exemplary fashion—shows preferred embodiments of the light module package according to the invention.

Figure 2:
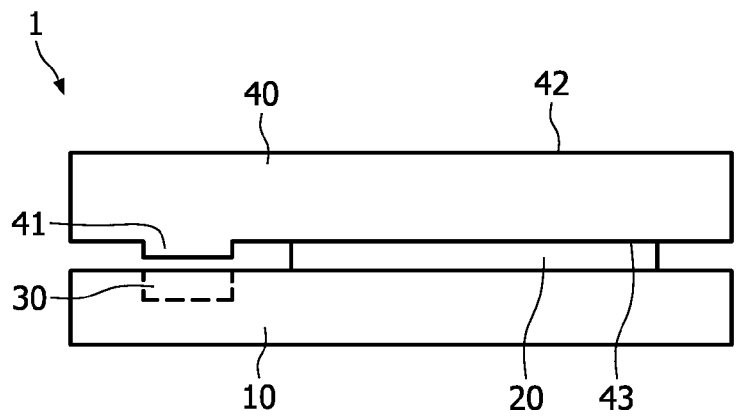
Figure 3:
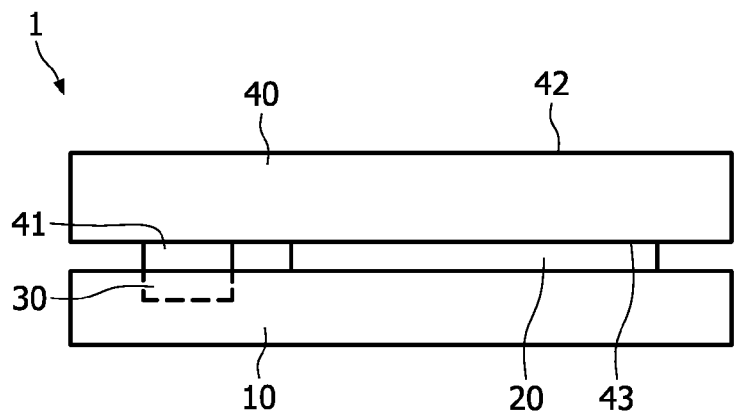
Figure 4:
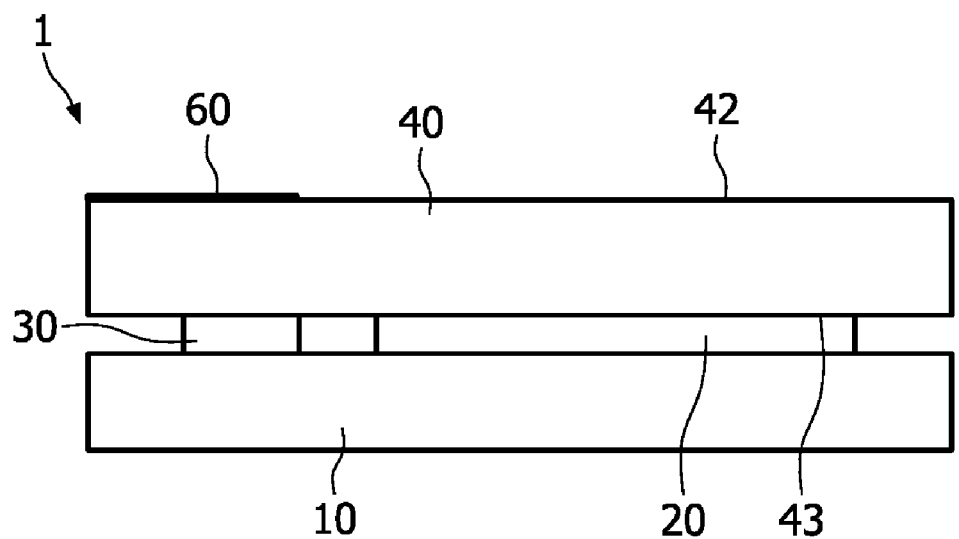
Figure 5:
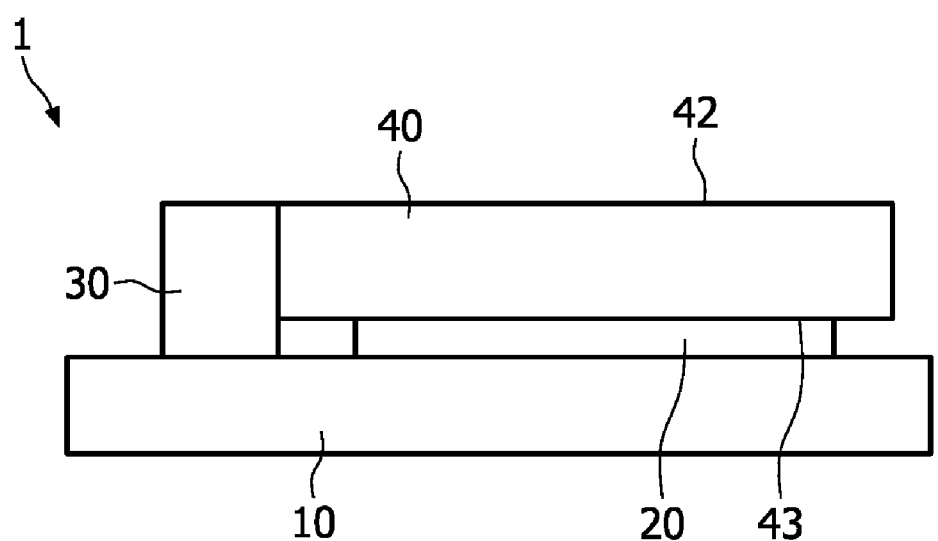

FIG. 1 shows a very schematic view of a light module package according to a first embodiment of the present invention, FIG. 2 shows a very schematic view of a light module package according to a second embodiment of the present invention, FIG. 3 shows a very schematic view of a light module package according to a third embodiment of the present invention, FIG. 4 shows a very schematic view of a light module package according to a fourth embodiment of the present invention, and FIG. 5 shows a very schematic view of a light module package according to a fifth embodiment of the present invention.

FIG. 1 shows a light module package 1, with a mounting substrate 10 and a luminescent ceramic layer 40, wherein a LED 20 is disposed between both said layers. Adjacent to the LED 20 and between the mounting substrate 10 and the ceramic layer 40 a light sensor 30 is placed in order to detect a luminous output of the light emitting diode 20. The ceramic layer 40 is only partly translucent to shield the light sensor 30 against ambient light. In the shown embodiments of the invention the ceramic layer 40 comprises a rigid agglomerate of phosphor particles. During the drive of the light module package 1 the LED 20 emits primary light directed to the ceramic layer 40. In the ceramic layer 40 the primary light is converted into a secondary light with a different wavelength, which is leaving the light module package 1. The sensitive area of the light sensor 30 is faced directly to the ceramic layer 40 in order to measure the luminous output of the light emitting diode 20. The light sensor 30 can receive primarily directly a fraction of the light emitted by the LED 20, or it may primarily receive light converted by the luminescent ceramic 40, or it may receive a combination of both. This can be controlled by applying appropriate filter layers on top of the light sensor 30 at its interface towards the luminescent ceramic 40. The light sensor 30 provides a feedback signal to a not shown power supply, which can drive the LED 20 with stabilized flux and predetermined brightness and/or color.

Additionally, the light module package 1 can comprise a temperature sensor 50, which is disposed between the ceramic layer 40 and the mounting substrate 10 adjacent to the LED 20 measuring the temperature of the light emitting diode 20. Like the light sensor 30 the temperature sensor 50 provides a feedback signal to the power supply in order to control the drive of the LED 20. Additionally, the temperature sensor 50 can measure the temperature of the light sensor 30. In this case the temperature sensor 50 can be placed between the light sensor 30 and the LED 20, which is not shown explicitly.

The ceramic layer 40, which can comprise a multi layer structure having at least two single ceramic layers being attached to each other, is formed with a top face 42 and a bottom face 43, wherein the bottom face 43 is directed to the mounting substrate 10.

FIG. 2 shows another embodiment of the invention, wherein the light sensor 30 is integrated into the mounting substrate 10. The ceramic layer 40 comprises a light guide 41 being nose-shaped, wherein the ending of the light guide 41 is located in a distance to the light sensor 30. The light guide 41 supports the transport of the desired amount of light converted by the ceramic layer 40 to the light sensor 30. In this embodiment the ceramic layer 40 and the light guide 41 are one uniform piece.

In another embodiment of the invention the light guide 41 can be made of a different material as the ceramic layer 40, which is shown in FIG. 3. The light guide 41 extends to the light sensor 30 contacting the sensitive area of the light sensor 30.

According to FIG. 4 the luminescent ceramic 40 is partly covered on the top face 42 by a reflecting layer 60. The reflecting layer 60 is a metal layer being metallized on the ceramic layer 40. The reflecting layer 60, being placed above the light sensor 30, provides an additional shielding against ambient light.

FIG. 5 shows a further possibility of the inventive light module package 1, wherein the light sensor 30 is disposed adjacent to the ceramic layer 40. In this case the sensitive area of the light sensor 30 is on its right side directed to the ceramic layer 40. The light sensor 30 serves as an additional shielding to the LEDs, which can be disposed adjacent to the light module package 1, which are not shown in the embodiments.

LIST OF NUMERALS

1 light module package
10 mounting substrate
20 light emitting diode
30 light sensor
40 ceramic layer
41 light guide
42 top face of ceramic layer
43 bottom face of ceramic layer
50 temperature sensor
60 reflecting layer

What is claimed is:

1. A light module package comprising:
   at least one light emitting diode;
   a mounting substrate for mounting and electrically contacting the at least one light emitting diode,
   a ceramic layer comprising a wavelength converting material and disposed in a path of light emitted by the light emitting diode,
   a light sensor disposed at the mounting substrate and having a sensitive area for detecting a luminous output of the light emitting diode wherein
   the sensitive area directly faces the ceramic layer and
   the ceramic layer is only partly translucent to shield the light sensor against ambient light.

2. A light module package as claimed in claim 1, wherein the light sensor is integrated into the mounting substrate.

3. A light module package as claimed in claim 1 wherein the ceramic layer comprises a light guide directed to the light sensor.

4. A light module package as claimed in claim 3, wherein the light guide extends to the light sensor.

5. A light module package as claimed in claim 1, wherein the ceramic layer comprises a reflecting layer for providing an additional shielding against ambient light.

6. A light module package as claimed in claim 5, wherein the ceramic layer has a top face and a bottom face (43), wherein the bottom face (43) is directed to the mounting substrate, wherein the reflecting layer is disposed on the top face.

7. A light module package as claimed in claim 1, further comprising a temperature sensor disposed at the mounting substrate for measuring the temperature of the light emitting diode and/or of the light sensor.

8. A light module package as claimed in claim 1, wherein the ceramic layer comprises a rigid agglomerate of phosphor particles.

9. A light module package as claimed in claim 1, wherein the light sensor is disposed adjacent to the ceramic layer.

* * * * *